(12) United States Patent
Omasa

(10) Patent No.: US 6,261,435 B1
(45) Date of Patent: Jul. 17, 2001

(54) PLATING METHOD

(75) Inventor: Ryushin Omasa, Fujisawa (JP)

(73) Assignee: Nihon Techno Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/062,125

(22) Filed: Apr. 17, 1998

(30) Foreign Application Priority Data

Oct. 21, 1997 (JP) ...................................... 9-306629

(51) Int. Cl.[7] .............................. C25D 5/34; C25D 5/00; C25D 5/20; B05D 3/04; B05D 3/12
(52) U.S. Cl. .......................... 205/205; 205/137; 205/148; 205/920; 427/96; 427/304; 427/346
(58) Field of Search ...................................... 427/346, 304, 427/96; 205/148, 137, 205, 920

(56) References Cited

FOREIGN PATENT DOCUMENTS

| 2086762 | * | 3/1990 | (CA) . |
|---|---|---|---|
| 50-3033 | | 1/1975 | (JP) . |
| 56-62998 | | 5/1981 | (JP) . |
| 58-18798 | | 4/1983 | (JP) . |
| 62-32690 | | 5/1985 | (JP) . |
| 61-46559 | | 10/1986 | (JP) . |
| 62-154797 | | 7/1987 | (JP) . |
| 3-294497 | | 12/1991 | (JP) . |
| 3275130 | | 12/1991 | (JP) . |
| 6-71544 | | 12/1991 | (JP) . |
| 5-508744 | | 12/1993 | (JP) . |
| 6-299398 | * | 10/1994 | (JP) . |
| 06304461 | | 11/1994 | (JP) . |
| 06312124 | | 11/1994 | (JP) . |
| 06330395 | | 11/1994 | (JP) . |
| 08173785 | | 7/1996 | (JP) . |
| 09040482 | | 2/1997 | (JP) . |
| 92/01088 | | 1/1992 | (WO) . |

OTHER PUBLICATIONS

Dainippon Tosho Co., Ltd., "Chemical for One Hundred Million People (II), Plating and High Technology", pp. 92–97, Sep. 20, 1997.*

Nikkan Kogyo Shinbun Co., Ltd., "Plating Technique Handbook", Jul. 25, 1971.

English language abstract for Sho-57–67192, corresponding to 61–46559 Oct. 15, 1986.

English language abstract for Hei-3–275130, corresponding to 6–71544 Dec. 5, 1991.

Communication and European Search Report No. EP 98 10 7707 dated Jan. 28, 1999.

* cited by examiner

Primary Examiner—Edna Wong
(74) Attorney, Agent, or Firm—Pitney, Hardin, Kipp & Szuch LLP

(57) ABSTRACT

In a plating method for successively treating a plating target from a pre-treatment step until a plating treatment, (A) a vibrationally stirring apparatus for a treatment bath, (B) an aeration apparatus for the treatment bath, (C) an apparatus for swinging an electrode bar for suspending the plating target thereon, and (D) an apparatus for applying vibration to the electrode bar, are operated in a cleaning tank and at least one of an electroless plating tank and an electroplating tank used as a treatment tank in the pre-treatment step and the plating step.

13 Claims, 7 Drawing Sheets

PLATING METHOD

BACKGROUND OF THE INVENTION

1. Field of the Invention

The present invention relates to a novel plating method which is suitably used to plate a plating target having a micropore, and a novel continuous plating method which uses means for vibrating the plating target at 10 to 60 Hz in addition to vibrational stirring means for a plating bath, aeration and swinging means for swinging the plating target which have been hitherto known. The plating method of the present invention is applicable to any method of an electroplating method, an electroless plating method and a method of using the electroplating method and the electroless plating method in combination.

2. Description of the Related Art

A printed wiring board is used as a board on which various kinds of elements are mounted to mutually wire these elements to one another in all electric equipment from radios, televisions to computers. In such a surface mount type of printed wiring board that parts are attached onto the surface of a board to be connected to one another, a multi-pin structure and a narrow-pitch design have recently propagated, and this technique has been improved more and more in such a situation that a 60-pin/1.0 mm pitch design has been developed and improved through 400-pin/0.3 mm pitch level to 400-pin/0.25 mm–0.3 mm pitch level, and further higher level.

Such an improvement of this technique has promoted a requirement for compact-size and high performance. Accordingly, the diameter of minute through holes required for the wiring between different layers on a laminate type printed wiring board and the diameter of minute holes having a dead end structure (i.e., blind holes) have been increasingly reduced, and at present the diameter is reduced from 0.2 mm or less to 0.05 mm or less, further to 0.03 mm or less.

Air, dust or treatment liquid which is trapped in these microstructured holes cannot be easily removed from the holes, and thus the following disadvantages occur. A first disadvantage resides in that portions at which air or dust exists are hardly plated, so that a conduction failure occurs. A second disadvantage resides in that entrance of plating liquid into a hole is insufficient, and thus the thickness of a plating film outside the hole is different from that inside the hole. A third disadvantage resides in that a non-plated portion occurs in a hole, so that a resistance value is increased even when conduction is established.

On the other hand, a technique disclosed in Japanese Patent Application Publication No. Hei-6-71544 which was previously developed by the inventor of this application contains a technique for vibrating a vibration plate at a vibrational amplitude of 8 to 20 mm and at a vibration frequency of 200 to 600 times per minute in a plating bath to stir the plating bath, thereby performing a plating treatment. Particularly it is proposed that aeration and swing means for a target to be treated are used in combination. The inventor of this application has considered that occurrence of plating-failure portions in the conventional plating method could be avoided if the technique disclosed in the Japanese Patent Application Publication No. Hei-6-71544 is applied to plating of minute holes (micropores) of an article having the minute holes, and has made various attempts. As a result, it has been found out that the fraction defective is surely reduced, however, it does not reach a satisfactory value.

Further, Japanese Patent Application Laid-open No. Sho-62-32690 proposes a method of plating a plating target while swinging and vibrating the plating target. It is merely disclosed that the vibration is generated by supplying air to a vibrator, however, the details such as the type of the vibration, etc. are unclear.

The inventor of this application has repetitively made tests under various combinations and conditions while varying the vibrational stirring condition of the plating bath, the aeration condition and the swinging condition of the plating target, however, satisfactory results cannot be obtained. As final means, the inventor has tried to apply to a plating target such vibrating means that is used to vibrationally stir the solution. As a result, the inventor has found out that the fraction defective can be unexpectedly remarkably reduced, and implemented the present invention.

SUMMARY OF THE INVENTION

An object of the present invention is to provide a plating method and a plating apparatus for surely and uniformly plating minute holes having a diameter of 0.2 mm or less, preferably a diameter less than 0.1 mm, more preferably a diameter of 0.05 mm or less, and still more preferably a diameter of 0.03 mm or less which are indispensable for minute wiring of a printed wiring board, an IC board, etc., thereby reducing the incidence of defective products due to incompleteness of wiring to zero as much as possible.

In order to attain the above object, there is provided a plating method for successively treating a plating target from a pre-treatment step for plating until a plating treatment, characterized in that all the following steps (a) to (d) are simultaneously carried out in a cleaning tank and at least one of an electroless plating tank and an electroplating tank used in the pre-treatment step and the plating step:

(a) a step of vibrationally stirring a treatment bath, (b) a step of performing an aeration in the treatment bath, (c) a step of swinging the plating target, and (d) a step of applying vibration to the plating target.

In the plating method as described above, the treatment bath is vibrationally stirred by vibrating a vibration vane at an amplitude (width of vibration) range from 0.5 to 3.0 mm and at a vibrational frequency of 200 to 800 times per minute; the aeration is performed by using air bubbles generated by a diffuser pipe having a pore opening of 200 to 400 $\mu$m; the plating target is swung at an amplitude (width of swing) of 10 to 100 mm and at a swing frequency of 10 to 30 times per minute; and, the plating target is vibrated at an amplitude of 0.5 to 1.0 mm and at a vibrational frequency of 100 to 300 times per minute.

In order to attain the above object, there is also provided a plating method for successively treating a plating target from a pre-treatment step until a plating treatment, characterized in that (A) a vibrationally stirring apparatus for a treatment bath, (B) an aeration apparatus for the treatment bath, (C) an apparatus for swinging an electrode bar on which the plating target is suspended, and (D) an apparatus for applying vibration to the plating target through the electrode bar in the amplitude range from 0.5 to 1.0 mm by using a vibration motor whose frequency is adjusted to 10 to 60 Hz by an inverter, are operated in a cleaning tank and at least one of an electroless plating tank and/or an electroplating tank used in the pre-treatment step for plating and the plating step.

In the plating method as described above, the vibrationally stirring apparatus for the treatment bath preferably includes vibration generating means containing a vibration motor, vibrationally stirring means for vibrating at an amplitude of 0.5 to 3.0 mm and at a vibrational frequency of 200 to 800 times per minute a vibration vane which is fixed in one stage or in multistage to a vibrating bar which interlocks with the vibration generating means to vibrate in a treatment tank, an inverter for controlling the vibration motor to generate any low-frequency vibration at any frequency in the range from 10 to 500 Hz, preferably from 30 to 60 Hz, and more preferably from 30 to 40 Hz, and vibration stress dispersing means at a connection portion of the vibration generating means and the vibrationally stirring means.

The aeration apparatus for the treatment bath is not limited to a specific one, however, it may be provided with an air diffusing pipe which is designed in such a manner that an area containing the plating target can be sufficiently stirred with air bubbles.

For example, in the case of a diffusing pipe which is obtained by forming many holes each having a pore size of about 1 mm in a pipe of synthetic resin such as PVC, electrolytic heat cannot be effectively removed because air bubble size is excessively large, and there occurs a dispersion in electrical resistance of the board obtained by the plating. On the other hand, the aeration apparatus according to the present invention uses a ceramic porous pipe as a diffusing pipe, and thus the above problem can be avoided. A high-temperature sintered ceramic pipe which contains alumina grain such as ALUNDUM (trade name) Aluminum oxide, of the Norton Company as bone material is preferably used as the ceramic porous pipe. The pore-size of the diffusing pipe is suitably set to 200 to 400 microns, and porosity (the ratio of the area of pores to the surface area) is preferably set to about 30 to 40%. The outer diameter of the diffusing pipe is usually set to 50 to 100 mm, and the length thereof is usually set to about 100 to 200 mm although it is varied in accordance with the length of a treatment tank. A method of disposing the diffusing pipe is not limited to a specific one, however, if plural diffusing pipes are used, they are disposed at both sides of the plating target. The interval between the diffusing pipes is preferably set to 100 to 200 mm, and the interval in the vertical direction between the diffusing pipe and the plating target is preferably set to 100 to 300 mm.

The swing motion which is applied through the electrode bar on which the plating target is suspended is preferably set so as to have a swing width of 10 to 100 mm, preferably 20 to 60 mm and a swing frequency of 10 to 30 times per minute.

The frequency (Hz) of the vibration motor for inducing oscillation to the electrode bar is preferably set to 50 to 65% of the frequency of the vibration motor of the vibrationally stirring apparatus (A). Specifically, the frequency thereof is set to 10 to 60 Hz, preferably 20 to 35 Hz, and the amplitude thereof is set to 0.5 to 1.0 mm. This oscillation also vibrates the plating target, however, it does not cause flow of treatment liquid.

The plating method according to the present invention is remarkably effective to plate an article having minute holes (micropores), particularly to plate a laminate type board having a plastic surface such as a printed wiring board, an IC board or the like which has minute holes (micropores). Particularly, this method is more effective to plate a printed wiring board, an IC board, a metal board, a plastic board, etc. which has micropores each having a diameter of 0.2 mm or less, preferably a diameter less than 0.1 mm, more preferably a diameter of 0.05 mm or less, and still more preferably a diameter of 0.03 mm or less. The diameter of the micropore can be 0.01 mm.

As electroless plating and/or electroplating may be used copper plating, nickel plating, silver plating, tin plating, gold plating, palladium plating, solder plating or the like.

The pre-treatment of the present invention means various pre-treatments on a plating target such as acid washing, degreasing, specific pre-treatment on each plating target, etc. as described in "PLATING TECHNIQUE HANDBOOK", pp 117–148 issued by Nikkan Kogyo Shinbun Co., Ltd. (Japan) on Jul. 25, 1971, and pre-treatments on plastic such as cleaning, etching, catalyzing, chemical plating, activation, copper strike, etc. The plating step contains various electroplating steps, and an electroless plating step.

The apparatuses of (A), (B), (C) and (D) are operated in at least all the main steps in the continuous plating method, and preferably operated in all the steps. The main step includes a cleaning step such as solvent cleaning (solvent degreasing), alkaline cleaning, emulsion cleaning, acid cleaning and electrolytic cleaning.

During an electrolytic process in plating solution, hydrogen gas occurs on a cathode (target to be treated) to generate minute bubbles in the solution, and the overall surface of the target is covered with the bubbles, so that the electrical resistance is increased, the plating speed is reduced and further uniformity of electrodeposition is disturbed. However, the surface tension of the liquid can be remarkably reduced by providing the treatment liquid with the flow which is induced by the low-frequency vibration as described above, so that most of the gas occurring on the surface of the treatment target is directly discharged to the outside. Therefore, the current distribution is made more uniform and the electric resistance is also reduced, whereby the electrodeposition can be more uniformly performed at a high rate which is several times as high as the prior art.

In the case where the size of the micropores of the plating target is set to a very small size such as 20 to 50 microns, it is very difficult to achieve a desired effect with only the flow which is caused by the vibration as described above unless the treatment time is long. Therefore, the plating target itself is vibrated at a frequency of 100 to 300 times per minute by the vibration motor oscillating at a frequency of 10 to 60 Hz, preferably 20 to 35 Hz at the same time when it is swung at a frequency of 10 to 30 times per minute, whereby the flow of the treatment liquid into the micropores can be averaged in an extremely short time.

According to the present invention, by using the diffusing pipe, a lot of bubbles occurring in the diffusing pipe move upwardly while the overall plating target is enveloped by the bubbles, and then discharged to the outside. Therefore, the electrolytic heat (Joule heat) is effectively absorbed by the bubbles to cool the plating target rapidly, and also air and dust which are removed from the micropores of the plating target can be effectively discharged by the bubbles, so that burning or burnt deposits does not occur in the plating target and thus the plating target can be uniformly plated.

The combinative use of the respective means of (A), (B), (C) and (D) can more easily break down a boundary layer which is liable to be formed between a plated layer and a plating bath in treatment liquid, particularly in plating liquid, and thus the treatment liquid in the treatment bath can be extremely smoothly supplied to the surface of the plating target, which greatly contributes to uniformity of the treatment, smoothness and glossiness of the plated surface.

The representative steps in the continuous plating process for a printed wiring board are as follows:

○ cleaning water washing (rinsing) → etching → water washing → catalyzing → water washing → ○ electroless copper plating → water washing → washing with sulfuric acid → ○ copper sulfate plating (electroplating) → water washing → (drying)

In these steps, each water washing step is frequently performed by dividing the step into two steps and successively performing the respective steps in the respective two tanks, and the electroless plating and the electroplating are also performed while the respective treatment tank is divided into two tanks. A system for lifting up a plating target after a fixed time elapses and then moving it to a next tank is the simplest method of performing the continuous plating. According to this system, a treatment bath needing a long treatment time and a treatment bath needing a short treatment bath have the same treatment time insofar as they have the same number of treatment tanks. Accordingly, for the treatment bath needing a long time treatment, the treatment time can be lengthened by setting the number of treatment tanks to two or more. Further, for a step such as water washing step that it is needed to completely remove attached liquid of a previous step, it is better to change the treatment tank in view of the efficiency of water washing, and from this view point, it is significant to dispose a plurality of water washing tanks.

In the continuous plating process as described above, the apparatuses of (A), (B), (C) and (D) are used (operated) in at least the steps as indicated by ○, preferably in all the steps other than the water washing step, and more preferably in all the steps containing the water washing step.

The cleaning step may be a so-called degreasing step, or a step of swelling plastic in addition to degreasing.

The etching step was previously performed by mechanically forming unevenness on the surface of a target (i.e., mechanically roughening the surface of the target) by using sand blast or a liquid honing method, however, recently it has been general that the surface of a target is roughened by using a chemical treatment based on chemical liquid. For example, it is a step of roughening the surface of a plastic target by using mixed liquid of sulfuric acid and chromic acid, mineral acid, dense alkali solution.

The catalyzing step is performed by a catalyzer providing method of implanting a catalyzer layer of palladium or the like on the surface after etching treatment to make preliminary arrangements for the electroless plating. As the catalyzer providing method are used a sensitizing-activating method and a catalyzing-accelerating method. In the former method, plastic material is immersed in tin ion solution having strong reducing power to deposit tin on the surface of the plastic material, and then immersed in palladium solution having catalytic action to induce a redox reaction on the surface of the plastic material and fix the catalyzer layer on the surface of the plastic. In the latter method, plastic material is immersed in solution containing mixture of tin ions and palladium ions to deposit colloid-type palladium/tin or complex compounds of palladium/tin on the surface, and then removing tin and activating palladium ("CHEMICAL FOR ONE HUNDRED MILLION PEOPLE ( II), PLATING AND HIGH TECHNOLOGY" pp 92–97 issued on Sep. 20, 1992 by Dainippon Tosho Co., Ltd. and edited by The foundation of Japan Society of Chemical Engineers).

According to the present invention, (1) the inner surfaces of the micropores each having a pore opening size of 0.03 mm to 0.05 mm can be uniformly plated, whereby the fraction defective of the IC laminate board and the printed wiring board can be greatly reduced;

(2) the upper limit value of the current density at which burning or burnt deposits are about to appear in the plating process can be greatly increased, so that the plating efficiency can be greatly enhanced;

(3) the uniformity of the plating film indicated by the plating adhesion (%) and by σ can be remarkably enhanced;

(4) the gas pit fraction defective (%) can be greatly reduced;

(5) there is provided a method which is remarkably effective to a printed wiring board which has a high aspect ratio and has small holes; and (6) articles which are more excellent than those produced by the prior art can be obtained for a shorter time.

DETAILED DESCRIPTION OF THE PREFERRED EMBODIMENT

Figure 1:
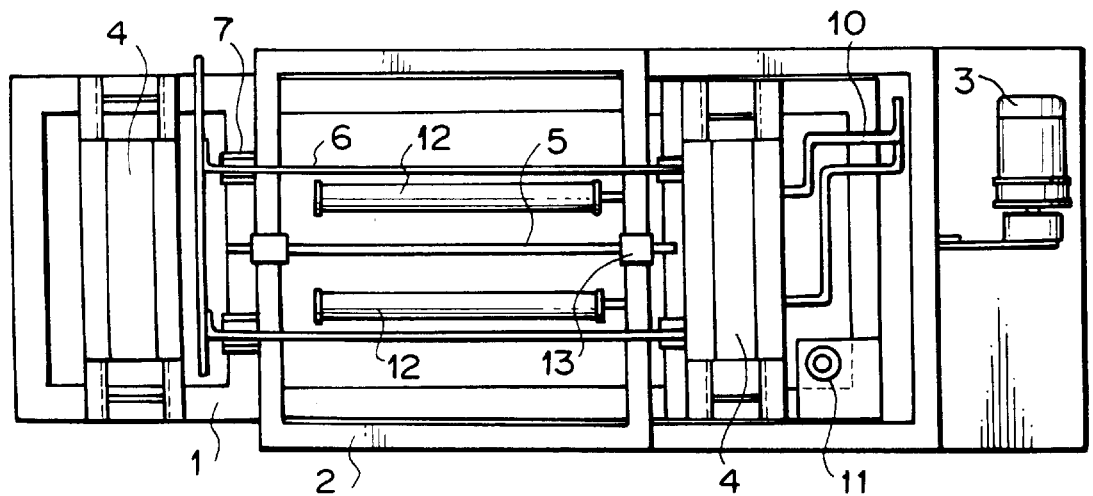
FIG. 1 is a plan view showing an embodiment of an apparatus used in the present invention.
Figure 2:
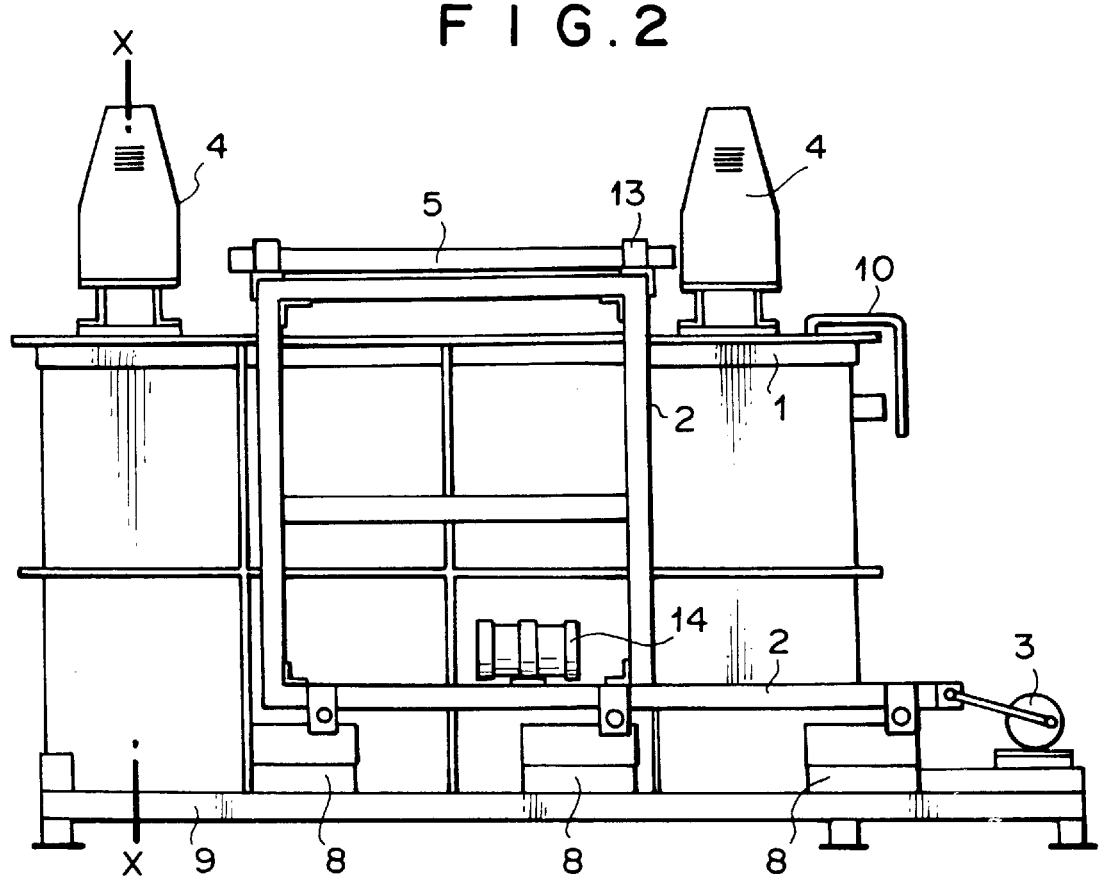
FIG. 2 is a front view showing the apparatus of FIG. 1.
Figure 3:
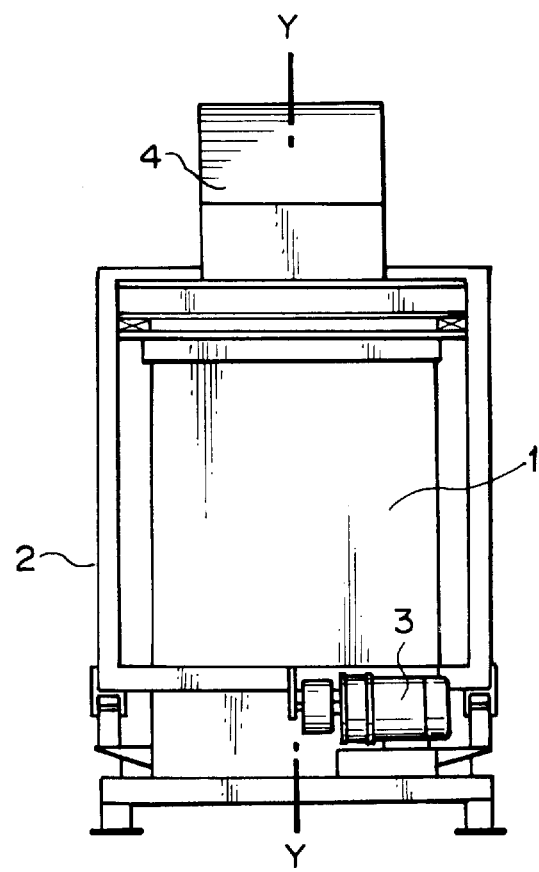
FIG. 3 is a side view showing the apparatus of FIG. 1.
Figure 4:
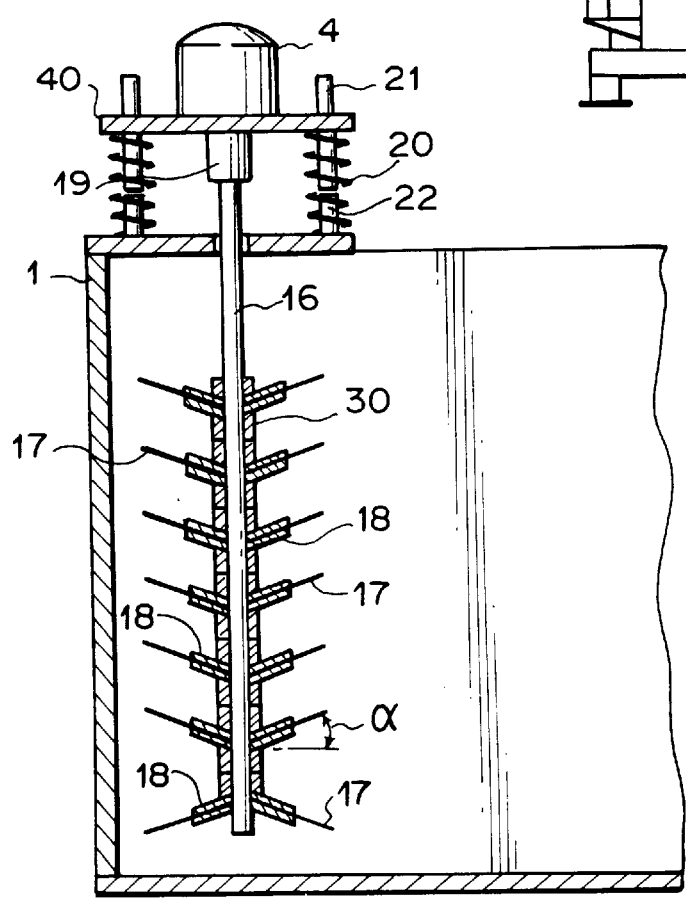
FIG. 4 is a cross-sectional view which is taken along a line Y—Y of FIG. 3.
Figure 5:
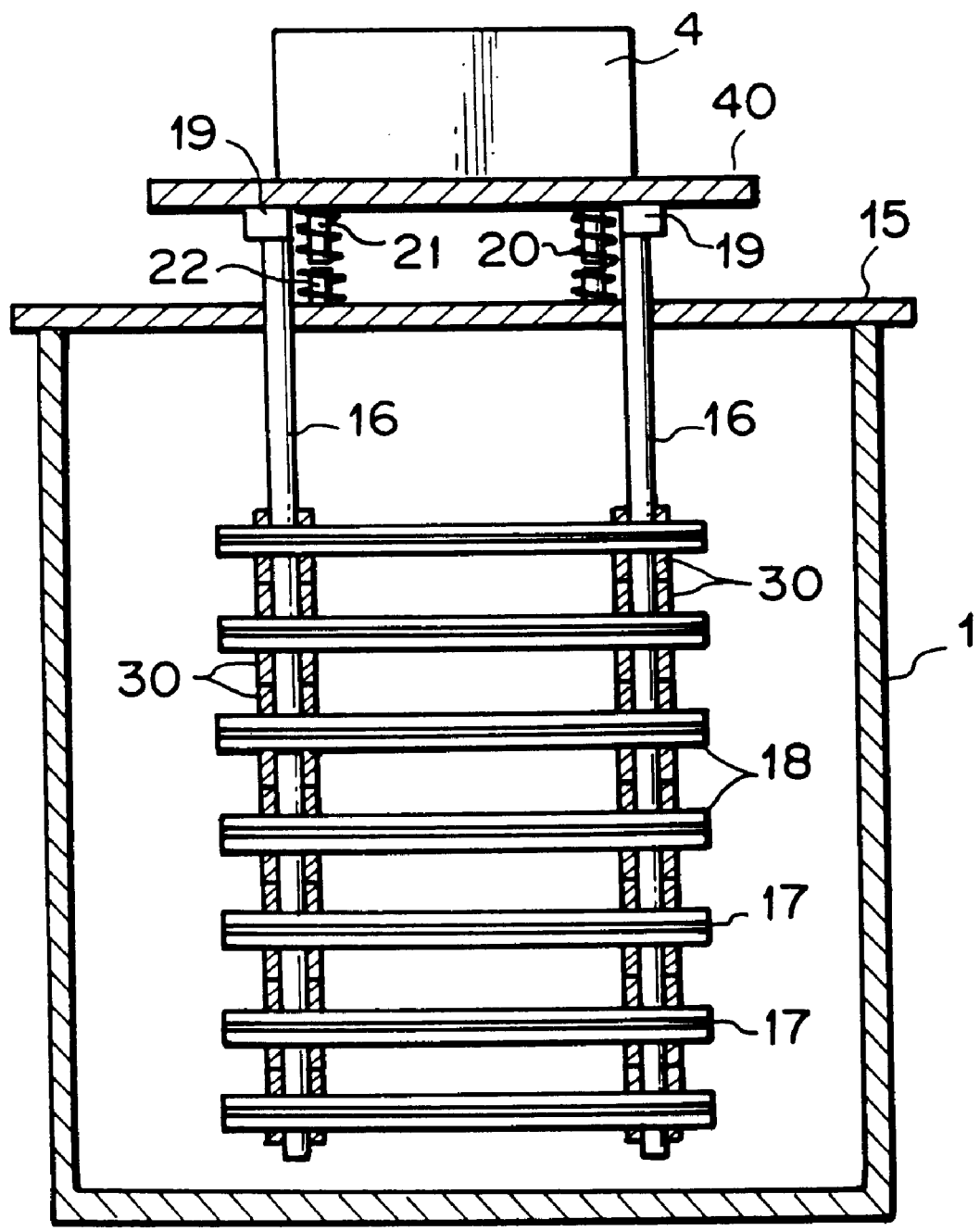
FIG. 5 is a cross-sectional view which is taken along a line X—X of FIG. 2.

FIGS. 1 to 3 show an example of the present invention in which the apparatuses of (A), (B), (C) and (D) are disposed in a pre-treatment tank or a plating tank, wherein FIG. 1 is a plan view, FIG. 2 is a front view and FIG. 3 is a side view. Only a vibrationally-stirring apparatus containing an vibration motor 4 shown in FIGS. 1 to 3 is shown in FIGS. 4 and 5 which are cross-sectional views thereof. FIG. 4 is a cross-sectional view which is taken along a line Y—Y of FIG. 3, and FIG. 5 is a cross-sectional view which is taken along a line X—X of FIG. 2.

In FIGS. 1 to 3, the aeration apparatus of (B) includes two diffusing pipes 12 disposed on the bottom plate of the treating tank(pre-treatment tank or plating tank) 1, and a compressed air inlet port 10 through which compressed air is fed to the diffusing pipes 12.

In FIGS. 1 to 3, the swing apparatus of (C) is provided with a swing motor 3, a swing support frame 2 which is swung by the motion of the swing motor 3 and a suspending member 5 which also serves as a cathode bar and is fixed to the swing support frame 2 by a cathode bar support 13. An object to be plated (hereinafter referred to as a plating target) is electrically and physically fixed to the cathode bar/suspending member 5. The swing motion is made slowly at an amplitude of 10 to 100 mm, preferably 20 to 50 mm and at a frequency of 10 to 30 times per minute. The swing support frame 2 is swung in the right-and-left direction in FIGS. 1 and 2 so that the bottom portion thereof moves on guide members 8 attached to a base member 9, to which the swinging motor 3 is attached.

In order to apply vibration to the swing support frame 2, the vibration motor 14 is fixed to a proper place of the swing support frame 2. The oscillation of the vibration motor 14 vibrates the swing support frame 2, and the vibrational motion of the swing support frame 2 is transmitted to the plating target such as an IC board or the like. With these members the vibration applying apparatus (D) is formed. The vibration motor 14 generates vibration of 10 to 60 Hz, preferably 20 to 35 Hz by an inverter, and the swing support frame 2 is vibrated at an amplitude of 0.5 to 1.0 mm and at a frequency of 100 to 300 times per minute.

In FIG. 1, reference numerals 6, 7, 11 denote an anode, anode holder and heater, respectively.

An embodiment of the vibrationally-stirring apparatus (A) for the treating bath is shown in FIGS. 4 and 5. However, the vibrationally-stirring apparatus is not limited to this embodiment. For example, there may be used vibrationally-stirring apparatuses as disclosed in Japanese Patent Application Laid-open No. Hei-6-304461, Japanese Patent Application Laid-open No. Hei-6-312124 (corresponding to U.S. Pat. No. 5,375,926), Japanese Patent Application Laid-open No. Hei-6-330395, Japanese Patent Application Laid-open No. Hei-8-173785, Japanese Patent Application Laid-open No. Hei-9-40482 and Japanese Patent Application Publication No. Hei-6-71544 which were proposed by the inventor of this application.

In FIGS. 4 and 5, a basic vibration member 40 on which a vibration motor 4 is secured is loaded on the tank 1 via a plurality of coiled springs 20. Inside of each spring 20, there is positioned a lower supporting rod 22 secured to the treatment tank 1 vertically and an upper supporting rod 21 secured to the basic vibration member 40 vertically in alignment with the lower supporting rod 22. The upper end of the lower supporting rod 22 is separated by a certain distance from the lower end of the upper supporting rod 21.

Figure 6:
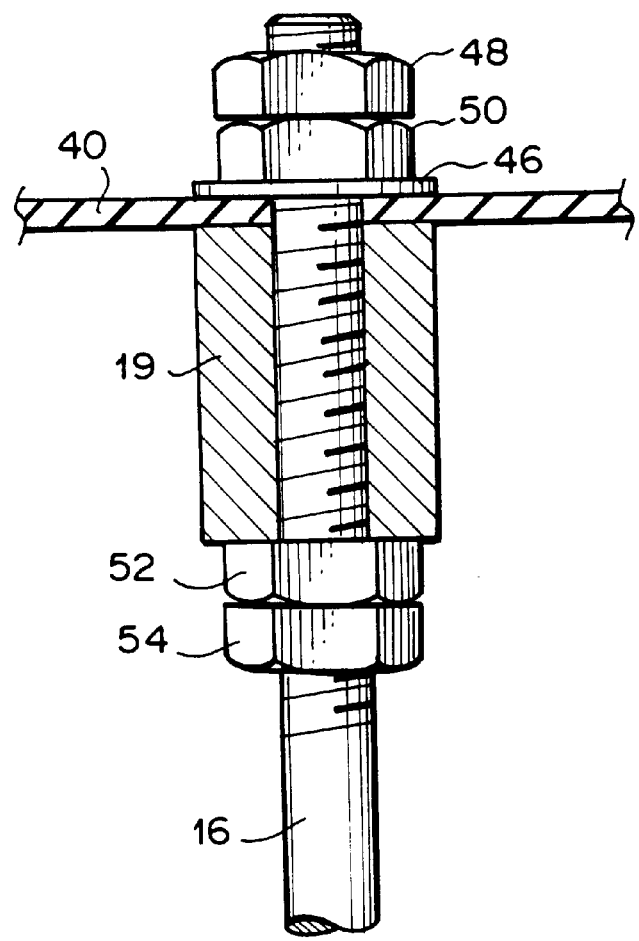
FIG. 6 shows an enlarged cross-section of a portion of a vibrating bar.

FIG. 6 shows an enlarged cross-section of a portion of each vibrating bar 16 attached to the basic vibration member 40. A vibrational stress dispersing means 19 formed of a rubber ring is provided around the vibrating bar 16 at the connection portion between the basic vibration member 40 of the vibration generating apparatus and the vibrating bar 16. Reference numeral 46 denotes a washer, 48, 50, 52 and 54 each a nut. The length of the rubber ring 19 is set to be longer than the diameter of the vibrating bar 16, usually to three to eight times of the diameter of the vibrating bar, and the outer diameter (size) thereof is set to 1.3 to 3.0 times of the diameter of the vibrating bar, preferably to about 1.5 to 2.5 times. From another viewpoint, when the vibrating bar 16 is a round bar having a diameter of 10 to 16 mm, the thickness of the rubber ring 19 is preferably set to 10 to 15 mm. When the diameter of the vibrating bar (round bar) is set to 20 to 25 mm, the thickness of the rubber ring is preferably set to 20 to 30 mm. In the case where no rubber ring is used, there is a problem that the vibrational stress is concentrated around the connection portion between the basic vibration member 40 and the vibrating bar 16, and thus the vibrating bar is liable to be broken. However, in this case, the above problem can be completely solved by fixedly inserting the rubber ring.

In FIGS. 4 and 5, on each vibrating bar 16, a spacer 30 is positioned between the neighboring vibration vanes 17 so that the vanes each held by a pair of vibration vane fixing members 18 are positioned at a certain interval.

The vibration vane 17 is preferably formed of thin metal, elastic synthetic resin, rubber or the like, and the thickness thereof may be set so that at least the tip portion of the vane plate shows a flutter phenomenon (as if it is corrugated) by the vertical oscillation of the vibration motor 4, whereby the oscillation is applied to the system or the treatment bath to induce fluidity. As the material of the metal vibration vane plate may be used titanium, aluminum, copper, steel, stainless steel, or alloy thereof. As the synthetic resin may be used polycarbonate, vinyl-chloride-based resin, polypropylene or the like. The thickness is not limited to a specific value, however, in order to transmit the oscillation energy and enhance the effect of the vibration, it is preferably set to 0.2 to 2 mm for metal, and 0.5 to 10 mm for plastics. If the thickness is excessively large, the vibrationally-stirring effect is reduced.

The vibration vane may be secured in one stage or in multistage to the vibration bar. A plurality of vibration vanes may be used in accordance with the depth of the treatment liquid. In the case where the number of stages is increased, if the load on the vibration motor is excessively increased, the vibrational amplitude may be reduced and the vibration motor may be heated.

Further, all the vibration vanes may be secured perpendicularly to the vibration bar or shaft. However, it is preferably that they are secured to be inclined at 5 to 30 degrees, preferably 10 to 20 degrees in (+) or (−) direction when the perpendicular direction to the vibration shaft is assumed to zero degree (see FIGS. 4 and 7).

The vibration vane fixing member 18 and the vibration vane 17 may be integrally inclined and/or bent when viewed from the side of the vibration shaft. Even when they are bent, they are preferably inclined at 5 to 30 degrees, preferably 10 to 20 degrees as a whole.

Figure 7:
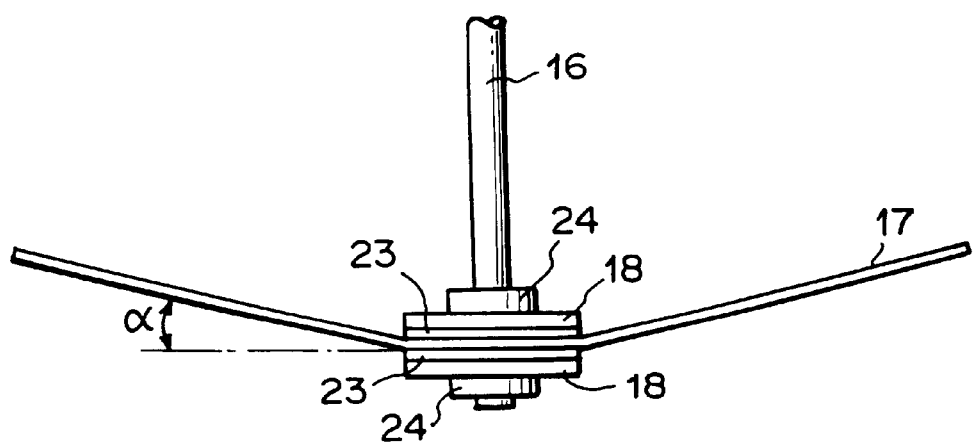
FIG. 7 is an enlarged partial cross-sectional view showing a manner of fixing vibration vanes to a vibration bar.

The vibration vanes 17 are fixed to the vibration bar 16 while pinched from the upper and lower sides by the vibration vane fixing member 18, thereby forming vibration vane portions. Specifically, threaded holes may be formed in the vibration bar 16 to fasten the vanes 17 to the vibration bar by screws. However, it is preferable that the vibration vane 17 is suppressed by the vibration vane fixing members 18 assistantly so that it is pinched from the upper and lower sides by the vibration vane fixing members 18 as shown in FIG. 7 and then the vibration vane fixing members 18 are fastened by nuts 24 to fix the vibration vane 17.

When the vibration vanes are inclined and/or bent, lower one or two of the many vibration vanes may be inclined and/or bent downwardly while the other vibration vanes are inclined and/or bent upwardly. With this structure, the stirring of the bottom portion of the treatment bath can be sufficiently preformed, and occurrence of traps at the bottom portion can be prevented.

When it is required not to stir only at the bottom portion of the treatment bath, the vibration vanes which are downwardly bent may be removed. This is effectively applied to such a case where undesired components such as deposits, etc. are reserved at the lower portion and removed from the lower portion without any dispersion of these undesired components in the tank.

Figure 8:
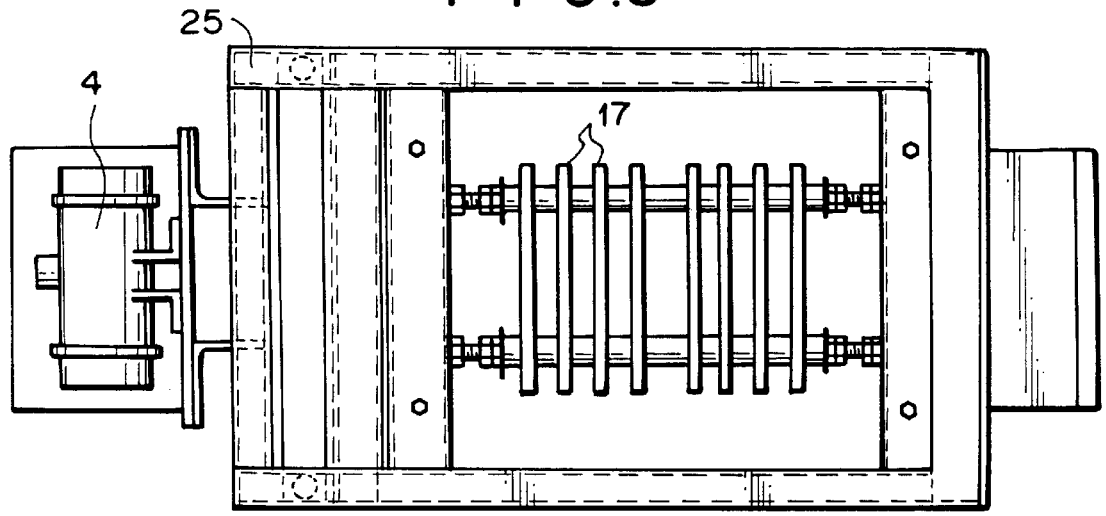
FIG. 8 is a plan view showing an embodiment of a lateral vibration stirring apparatus.
Figure 9:
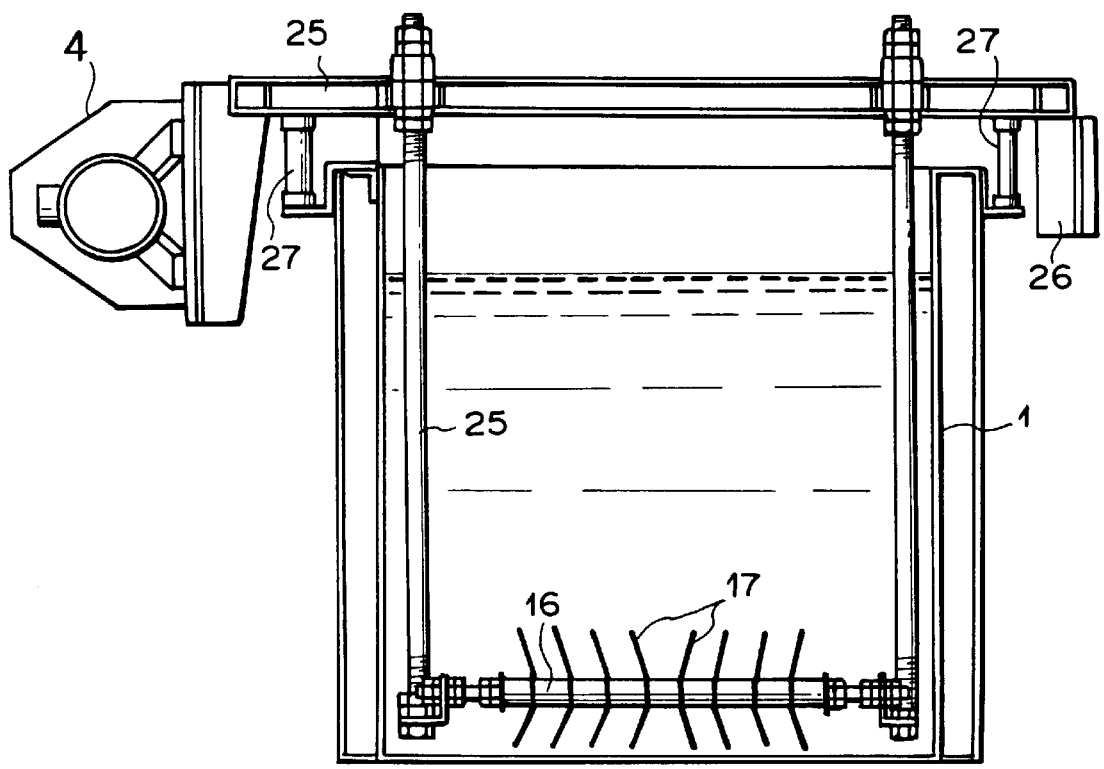
FIG. 9 is a cross-sectional view of FIG. 8.
Figure 10:
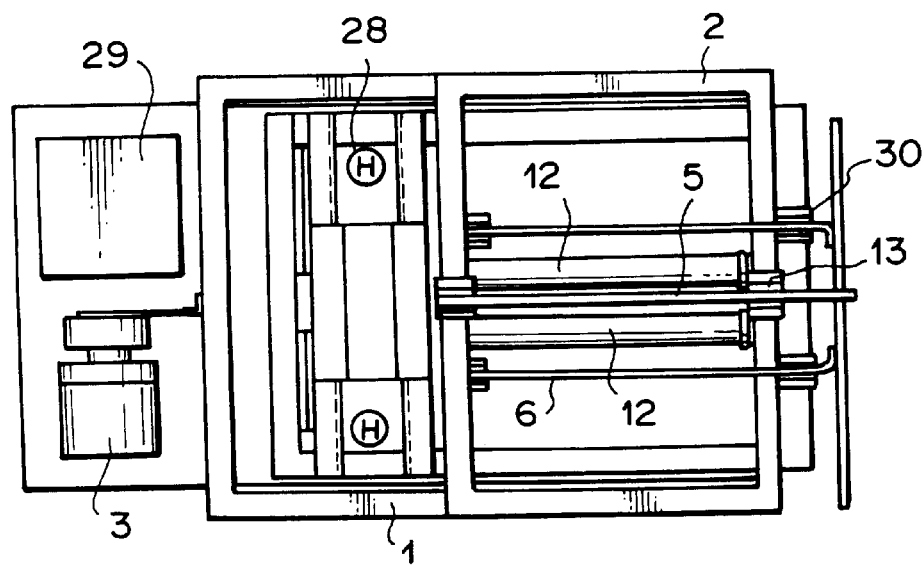
FIG. 10 is a plan view showing another embodiment of the apparatus used in the present invention.
Figure 11:
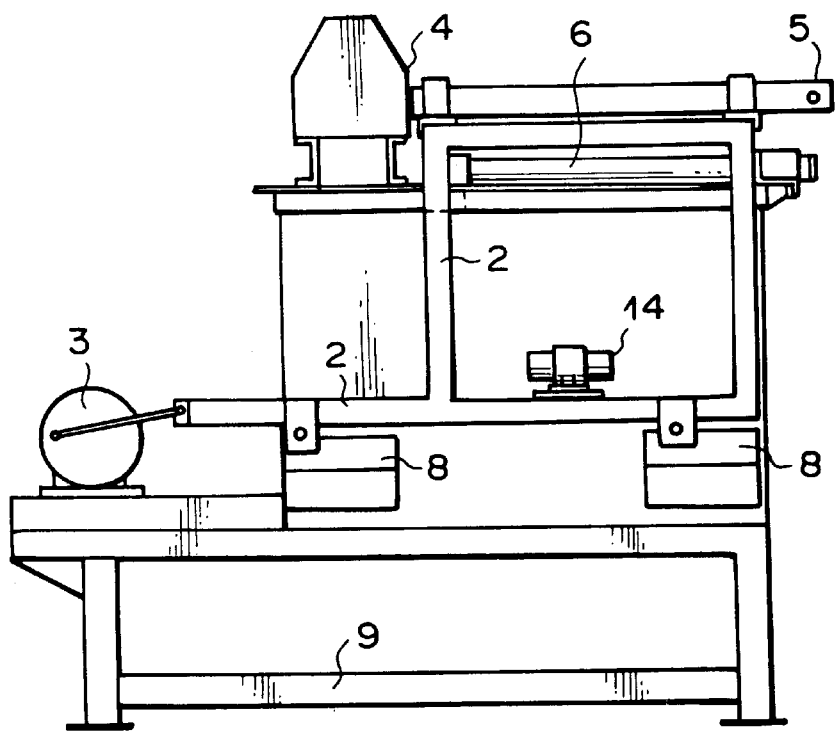
FIG. 11 is a front view of the apparatus of FIG. 10.
Figure 12:
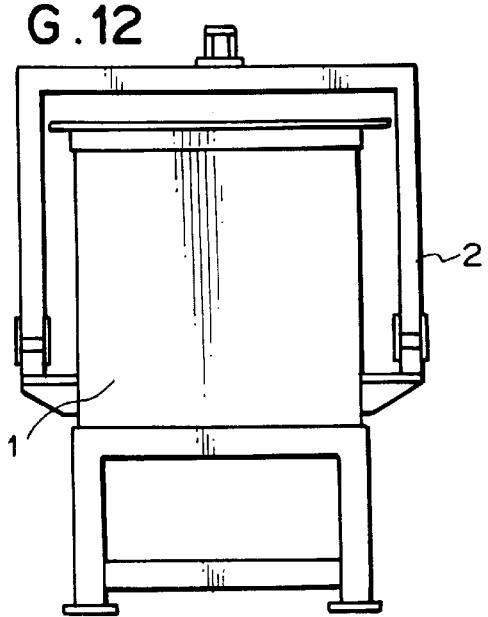
FIG. 12 is a side view of the apparatus of FIG. 10.

The vibrationally-stirring apparatus may be provided to one end of the treatment tank as shown in FIGS. 10 to 12, wherein reference numerals 28, 29 and 30 are heater, air compressor for aeration and cathode holder, respectively. However, it may be provided to both ends of the treatment tank as shown in FIGS. 1 to 3 to cope with a large-scale tank. Further, any vibrationally-stirring apparatus shown in the above-mentioned figures is of such a type that the vibration vanes are vibrated in the vertical direction. However, it may be designed so that the vibrational direction is set to the horizontal direction and the vibration vanes 17 are disposed at the bottom portion of the treatment tank 1 as disclosed in the above-mentioned Japanese Patent Application Laid-open No. Hei-6-304461, or as shown in FIGS. 8 and 9, wherein reference numeral 25 is an oscillation transmitting frame on which the vibration motor 4 is mounted, and reference numeral 27 is a support spring. In this case, in order to balance the left-side weight including the vibration motor 27 and the right-side weight, a balancer 26 is preferably disposed as shown in FIG. 9.

The vibration bar may be used while directly linked to the vibration motor. However, as disclosed in the above-mentioned Japanese Patent ApplicationLaid-open No. Hei-6-304461 and Japanese Patent Application Laid-open No. Hei-6-330395, it may be used in such a mode that the vibration of the vibration motor is transmitted to the vibration bar 16 through the vibration frame 25 as shown in FIGS. 8 and 9.

Further, fluorine-based polymer films 23 are preferably interposed between the vibration vanes 17 and the vibration vane fixing members 18 as shown in FIG. 7 because the damage rate of the vibration vanes can be greatly reduced. As the fluorine-based polymer may be used polytetrafluoroethylene (PTFE), tetrafluoroethylene/hexafluoropropylene copolymer (FEP), tetrafluoroethylene/perfluoroalkyl vinyl ether copolymer (PFA), polychlorotrifluoroethylene (PCTFE), polyvinylidene fluoride (PVDF), polyvinyl fluoride, ethylene/tetrafluoroethylene copolymer (ETFE), ethylene/chlorotrifluoroethylene copolymer, propylene/tetrafluoroethylene copolymer or the like. Particularly, fluorine-based rubber is preferably used.

Figure 13:
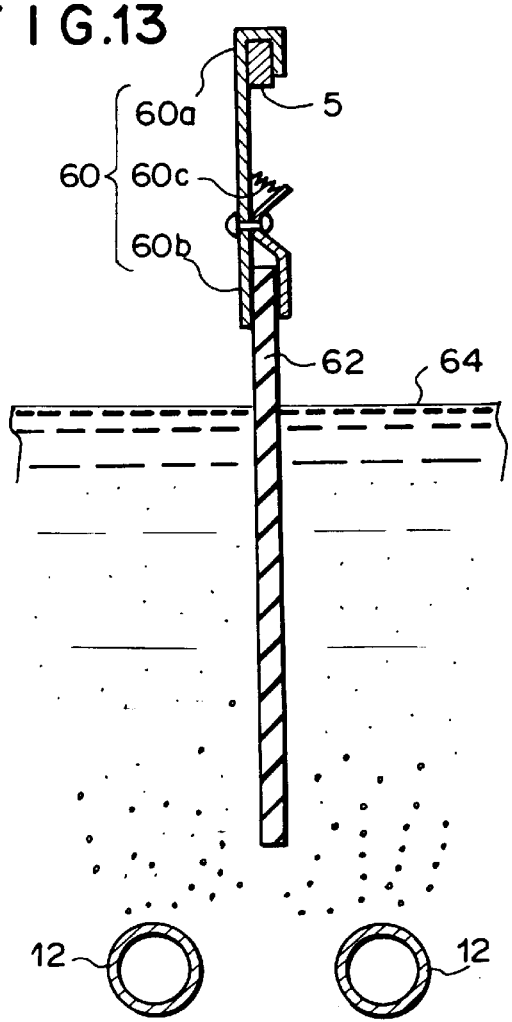
FIG. 13 shows a plating target suspended on a cathode bar when treatment is performed.

As shown in FIG. 13, when the plating target 62 is treated in the treatment bath 64, the plating target 62 is clamped by a target holder 60. The holder 60 comprises a hook portion 60a which is suspended to the cathode bar 5, a clamp portion 60b which hold the upper portion of the plating target 62 and a compression spring 60c for generating clamp force. Air bubbles are generated in the treatment bath 64 by the diffusing pipes 12. The plating target 62 is transported together with the holder 60 from a treatment tank to another treatment tank.

Examples according to the present invention and Comparative Examples will be described below, however, the present invention is not limited to the following Examples.

EXAMPLE 1

As shown in FIGS. 1 to 5, (A) a vibrationally stirring apparatus, (B) an aeration apparatus, (C) an apparatus for swinging an electrode (cathode) bar or a suspension member for a plating target, and (D) an apparatus for vibrating the plating target through the suspension member were disposed in a treatment tank 1, and the pre-treatment and the plating treatment were performed under the following conditions:
(1) Plating target
 The diameter of the minute through holes (micropores) which were formed in a copper-coated glass-reinforced epoxy laminate board of 0.5 mm in thickness and 340×340 mm in area were set to the following four values:
 (a) 0.5 mm
 (b) 0.2 mm
 (c) 0.1 mm
 (d) 0.05 mm (2) Arrangement of treatment tanks
 Degreasing tank (○) → hot water washing tank → water washing tank→ water washing tank → etching tank→ etching tank → water washing tank → water washing tank → first catalyzer tank (○) → second catalyzer tank (○) water washing tank → water washing tank → accelerator tank (○) → water washing tank→ water washing tank → electroless copper plating tank (○ ) → electroless copper plating tank (○) → water washing tank → water washing tank→ sulfuric acid tank → copper sulfate plating tank (○) → copper sulfate plating tank (○) → water washing tank→ water washing tank → drying tank.

The treatment time of each tank was set to 5 minutes, and the current density was set to 2 A/dm$^2$. The above four apparatuses of (A), (B), (C) and (D) were disposed in the (○)-affixed tanks.
(3) Vibrationally stirring apparatus
 Vibration motor: 250 W×200 V×3-phase
 Vibration vane effective area of 300×150 mm, thickness of 0.6 mm (six vibration vanes are used), α=15 degrees (all vanes are inclined upwardly)
 Amplitude of vibration vane: 1.5 mm
 Frequency of vibration motor: 40 Hz (adjusted by inverter)
(4) Aeration apparatus
 Two ceramic diffusing pipes (75 mm in outer diameter, 50 mm in inner diameter, 500 mm in length, about 200 microns in pore opening size) were used. The porosity of the pipe was set to 40%, and the air amount per one pipe was equal to about 40 liters per minute.
(5) Swing apparatus
 A swing motion having an amplitude of 40 mm was applied forwardly and backwardly at 20 times per minute by a gear motor or a cylinder motor.
(6) Vibrating apparatus provided on swing apparatus
 The vibration motor (40 W) 14 was fixed at a suitable place of the swing support frame 2, and the vibration motor 14 was swung at a frequency of 30 Hz and an amplitude of 0.8 mm through an inverter.
(7) Degreasing bath (inner dimension of tank: 450 (width)× 350 (length)×650 mm (height))
 Sodium carbonate 40 g/liter
 Sodium phosphate 20 g/liter
 Sodium hydroxide 5 g/liter
 Surfactant 1 g/liter
 Bath temperature and time 60° C., 5 minutes
(8) Etching bath (inner dimension of tank 450×180×650)
 Sulfuric acid (specific gravity 1.84) 500 milliliter/liter
 Phosphoric acid (specific gravity 1.74) 100 milliliter/liter
 Chromic anhydride 30 g/liter
 Bath temperature and time 65° C., 10 minutes
(9) First catalyzer bath (inner dimension of tank: 450×200× 650)
 Stannous chloride 10 g/liter
 Dense hydrochloric acid 40 milliliter/liter
 Bath temperature and time room temperature, 5 minutes
(10) Second catalyzer bath (inner dimension of tank: 450× 350×650)
 Palladium chloride 0.1 g/liter
 Hydrochloric acid 1 milliliter/liter
 Bath temperature and time room temperature, 5 minutes
(11) Accelerator bath (inner dimension of tank: 450×180× 650)
 Sulfuric acid 75 milliliter/liter
 Bath temperature and time 50° C., 5 minutes
(12) Electroless copper sulfate plating bath (inner dimension of tank: 450×350×650)

Copper sulfate ($CuSO_4/5H_2O$) 10 g/liter
Rochelle salt ($KNaC_4H_4O_6/4H_2O$) 35 g/liter
Sodium hydroxide 8 g/liter
Formalin 20 g/liter
Stabilizer slight
pH 12.5 to 13
Bath temperature and time 40° C., 10 minutes
(13) Copper sulfate plating bath (inner dimension of tank: 450×450×650)
Copper sulfate ($CuSO_4/5H_2O$) 75 g/liter
Sulfuric acid 190 g/liter
Conductivity providing agent 50 mg/liter
Brightening agent 5 milliliter/liter
Bath temperature and time 40° C., 10 minutes The pre-treatment and plating treatment were performed under the above conditions, and the result is shown in Table 1.

Comparative Example 1

Only the aeration apparatus (B) and the swinging apparatus (C) were disposed, and the same plating target as Example 1 was subjected to the pre-treatment and plating treatment by using each bath of Example 1. The result is shown in Table 1.

Comparative Example 2

The aeration apparatus (B), the swinging apparatus (C) and the vibrating apparatus (D) were disposed, and the same plating target as Example 1 was subjected to the pre-treatment and plating treatment by using each bath of Example 1, and the result is shown in Table 1.

Comparative Example 3

The vibrationally stirring apparatus (A), the aeration apparatus (B) and the swing apparatus (C) were disposed, and the same plating target as Example 1 was subjected to the pre-treatment and plating treatment by using each bath of Example 1, and the result is shown in Table 1.

TABLE 1

| | PP | QQ | RR | XX | YY | ZZ |
|---|---|---|---|---|---|---|
| Comparative Example 1 | (B) (C) | 0.5 | 3 | 42 | 4.5 | — |
| | | 0.2 | 3 | 40 | 4.5 | 20 |
| | | 0.1 | 3 | 14 | 4.5 | 30 |
| | | 0.05 | 3 | x [*3] | 4.5 | — |
| Comparative Example 2 | (B) (C) (D) | 0.5 | 3.5 | 52 | 4.0 | — |
| | | 0.2 | 3.5 | 38 | 4.0 | 10 |
| | | 0.1 | 3.5 | 20 | 4.0 | 20 |
| | | 0.05 | 3.5 | x | 4.0 | — |
| Comparative Example 3 | (A) (B) (C) | 0.5 | 4.0 | 60 | 3.5 | — |
| | | 0.2 | 4.0 | 53 | 3.5 | 5 |
| | | 0.1 | 4.0 | 42 | 3.5 | 10 |
| | | 0.05 | 4.0 | 18 | 3.5 | — |
| Example 1 | (A) (B) (C) (D) | 0.5 | 12.0 | 95 | 1.2 | — |
| | | 0.2 | 12.0 | 92 | 1.2 | 0 |
| | | 0.1 | 12.0 | 90 | 1.2 | 0 |
| | | 0.05 | 12.0 | 86 | 1.2 | — |

PP . . . Apparatus being used
QQ . . . Micropore size (mm)
RR . . . Maximum current density [*1] ($A/dm^2$)
XX . . . Plating adhesion degree of through hole [*2] (%)
YY . . . Standard deviation σ [*4]
ZZ . . . Fraction defective of gas pit [*5] (%)

[*1]: the maximum current density was defined as the maximum current density when the current density was gradually increased, but no burnt deposit occurred.

[*2]: [(average plating thickness in through hole at center portion relative to thickness direction) / (average plating thickness on flat surface of plating target)]×100

[*3]: x represents that no plating was carried out in through hole

[*4]: σ represents the standard deviation of dispersion of plating thickness

[*5]: the gas pit fraction defective (%) was determined on the basis of a method of detecting defectives due to adhesion of gas, etc. by finding out defectives through a visual examination using magnifying glass and an X-ray examination which were applied to test articles which had passed a plating conduction test.

EXAMPLE 2

The apparatuses (A), (B), (C) and (D) were disposed in the same arrangement as Example 1, however, the nickel plating was performed while the arrangement of the treatment tanks was changed as follows. In any case, the current density was set to 2 $A/dm^2$.

(1) Arrangement of treatment tanks
Degreasing/swelling tank (○) → water washing tank → etching tank (○) → water washing tank → neutralizer tank → water washing tank→ catalyzer tank → water washing tank → accelerator tank→ water washing tank → electroless nickel plating tank (○) water washing tank → activator tank → water washing tank → strike plating tank → water washing tank → copper sulfate plating tank → water washing tank → nickel plating tank → water washing tank.

The above four apparatuses of (A), (B), (C) and (D) were disposed in the (○)-affixed tanks.

(2) Degreasing/swelling bath
Sodium carbonate 90 g/liter
Sodium phosphate 20 g/liter
Sodium hydroxide 5 g/liter
Surfactant 1 g/liter
Water-soluble solvent 80 g/liter
Bath temperature and time 80° C., 5 minutes
(3) Etching bath
Chromic acid 400 g/liter
Sulfuric acid 400 g/liter
Bath temperature and time 65° C., 5 minutes
(4) Neutralizer bath
Hydrochloric acid 50 milliliter/liter
(5) Catalyzer bath
Palladium chloride 0.2 g/liter
Stannous chloride 20 g/liter
Dense hydrochloric acid 200 milliliter/liter
Bath temperature and time room temperature, 5 minutes
(6) Accelerator bath
Sulfuric acid 100 milliliter/liter
Bath temperature and time 50° C., 5 minutes
(7) Electroless nickel plating bath
Nickel sulfate 30 g/liter
Sodium hypophosphite 20 g/liter
Ammonium citrate 50 g/liter
Bath temperature and time 40° C., 10 minutes
(8) Activator bath
Sulfuric acid 50 g/liter
Bath temperature and time room temperature, one minute
(9) Strike plating bath
Nickel sulfate 200 g/liter
Nickel chloride 40 g/liter
Boric acid 40 g/liter
Bath temperature and time 50° C., 5 minutes
(10) Copper sulfate plating bath
Copper sulfate ($CuSO_4$, $15H_2O$) 75 g/liter
Sulfuric acid 190 g/liter
Conductivity providing agent 50 g/liter
Bath temperature and time 40° C., 10 minutes

(11) Nickel plating bath
  Nickel sulfate 200 g/liter
  Nickel chloride 40 g/liter
  Boric acid 30 g/liter
  Brightening agent slight
  Bath temperature and time 50° C., 10 minutes

Comparative Example 4

Only the aeration apparatus (B) and the swing apparatus (C) were disposed, and the same plating target as Example 2 was subjected to the plating treatment by using each bath of Example 2. The result is shown in Table 2.

Comparative Example 5

The aeration apparatus (B), the swinging apparatus (C) and the vibrating apparatus (D) were disposed, and the same plating target as Example 2 was subjected to the plating treatment by using each bath of Example 2, and the result is shown in Table 2.

Comparative Example 6

The vibrationally stirring apparatus (A), the aeration apparatus (B) and the swing apparatus (C) were disposed, and the same plating target as Example 2 was subjected to the plating treatment by using each bath of Example 2, and the result is shown in Table 2, in which reference signs PP, QQ, RR, XX, YY, and *3 denote the same meanings as those in Table 1.

TABLE 2

|  | PP | QQ | RR | XX | YY |
|---|---|---|---|---|---|
| Comparative | (B) (C) | 0.5 | 3.5 | 45 | 4.7 |
| Example 4 |  | 0.2 | 3.5 | 40 | 4.7 |
|  |  | 0.1 | 3.5 | 25 | 4.7 |
|  |  | 0.05 | 3.5 | x [*3] | 4.7 |
| Comparative | (B) (C) (D) | 0.5 | 4.0 | 55 | 4.5 |
| Example 5 |  | 0.2 | 4.0 | 40 | 4.5 |
|  |  | 0.1 | 4.0 | 30 | 4.5 |
|  |  | 0.05 | 4.0 | X | 4.5 |
| Comparative | (A) (B) (C) | 0.5 | 6 | 65 | 4.0 |
| Example 6 |  | 0.2 | 6 | 55 | 4.0 |
|  |  | 0.1 | 6 | 45 | 4.0 |
|  |  | 0.05 | 6 | 35 | 4.0 |
| Example 2 | (A) (B) (C) (D) | 0.5 | 14 | 98 | 1.5 |
|  |  | 0.2 | 14 | 90 | 1.5 |
|  |  | 0.1 | 14 | 88 | 1.5 |
|  |  | 0.05 | 14 | 84 | 1.5 |

EXAMPLE 3

The process of Example 1 was repeated except that the thickness of the printed wiring board was set to 0.8 mm and the diameter of the through holes was set to 0.1 mm. In this case, the thickness was set to be 1.6 times of that of Example 1, and (thickness)/(diameter)=0.8/0.1=8, that is, the aspect ratio was equal to 8 which was an extremely high value. The result is shown in Table 3, in which reference signs PP, QQ and XX denote the same meanings as those in Table 1.

Comparative Example 7

The same treatment as Comparative Example 1 was repeated on the same printed wiring board as Example 3 except that the aspect ratio was set to 8. The result is shown in Table 3.

Comparative Example 8

The same treatment as Comparative Example 2 was repeated on the same printed wiring board as Example 3 except that the aspect ratio was set to 8. The result is shown in Table 3.

Comparative Example 9

The same treatment as Comparative Example 3 was repeated on the same printed wiring board as Example 3 except that the aspect ratio was set to 8. The result is shown in Table 3.

TABLE 3

|  | PP | TT | QQ | VV | XX |
|---|---|---|---|---|---|
| Comparative Example 7 | (B) (C) | 0.8 | 0.1 | 8 | 20 |
| Comparative Example 8 | (B) (C) (D) | 0.8 | 0.1 | 8 | 30 |
| Comparative Example 9 | (A) (B) (C) | 0.8 | 0.1 | 8 | 45 |
| Example 3 | (A) (B) (C) (D) | 0.8 | 0.1 | 8 | 86 |

TT . . . Thickness of board (mm)
VV . . . Aspect ratio

Estimating the overall data of Tables 1 to 3, it is found that the combinative use of the apparatuses B, C and D or the combinative use of the apparatuses A, B and C somewhat improves the adhesion of the plating into the through holes and the standard deviation of the dispersion in plating thickness as compared with the combinative use of only the apparatuses B and C.

However, according to the present invention in which the four apparatuses A, B, C and D are used in combination, the adhesion of the plating into the through holes, the standard deviation and the gas pit fraction defective can be dramatically improved, and this effect becomes more remarkable and apparent by comparing Comparative Examples 2, 3 and Example 1, comparing Comparative Examples 5, 6 and Example 2, and comparing Comparative Examples 8, 9 and Example 3.

EXAMPLE 4

An apparatus shown in FIGS. 10 to 12 was used.
Plating target
  Two A 4-size glass-reinforced epoxy laminate boards of 8 mm in thickness, each being coated with copper and having minute through holes of 0.05 mm in diameter, were suspended in parallel to each other, and then plated.
  The same vibrationally stirring apparatus as Example 1 was used.
  As the aeration apparatus were used two diffusing pipes of 75 mm in outer diameter, 50 mm in inner diameter, 200 microns in pore-size and 40% in porosity.
  The swing apparatus gave a swing motion at 20 times per minute and at an amplitude of 30 mm.
1. Degreasing/swelling step (use of EMPLATE MLB-496 (degreasing agent), a product of MELTEX Co. Ltd. of Japan (trade name) containing water-soluble solvent formed of ethyl cellosolve and alkali components)
  Inner dimension of tank: 180×750×500 mm (width× length×height)
  Treatment condition: the four apparatuses (A), (B),(C), (D) were operated and the treatment was performed at 60° C. for 5 minutes.
2. Water washing step
  Treatment condition: the apparatus (B) was operated to perform water washing at room temperature for 5 minutes.
3. Etching step (use of EMPLATE MLB-497 (etching agent), a product of MELTEX Co. Ltd. of Japan (trade name) containing potassium permanganate)

Inner dimension of tank: 180×750×500

Treatment condition: the four apparatuses (A), (B), (C) and (D) were operated and the treatment was performed at 70° C. for 5 to 10 minutes.

4. Water washing step

Inner dimension of tank: 180×450×500

Treatment condition: the apparatus (B) was operated and the treatment was performed at room temperature for 5 minutes.

5. Water washing step

Inner dimension of tank: 180×450×500

Treatment condition: the apparatus (B) was operated and the treatment was performed at room temperature for 5 minutes.

6. Reducing step (use of EMPLATE MLB-791 (reducing agent), a product of MELTEX Co. Ltd. of Japan (trade name) containing $H_2SO_4$)

Inner dimension of tank: 180×750×500

Treatment condition: the four apparatuses (A), (B), (C) and (D) were operated, and the treatment was performed at 60° C. for 5 minutes.

7. Water washing step

Inner dimension of tank: 180×450×500

Treatment condition: the apparatus (B) was operated and the treatment was performed at room temperature for 5 minutes.

8. Conditioner step (MELPLATE PC-321 (surface conditioning agent), a product of MELTEX Co. Ltd. of Japan (trade name) containing surfactant)

Inner dimension of tank: 180×450×500

Treatment condition: the apparatus (B) was operated, and the treatment was performed at 60° C. for 5 minutes.

9. Water washing step

Inner dimension of tank: 180×450×500

Treatment condition: the apparatus (B) was operated and the treatment was performed at room temperature for 5 minutes.

10. Microetching step (use of MELPLATE AD-331 (microetching agent), a product of MELTEX Co. Ltd. of Japan (trade name) containing persulfate)

Inner dimension of tank: 180×450×500

Treatment condition: the apparatus (B) was operated, and the treatment was performed at 65° C. for 5 minutes.

11. Water washing step

Inner dimension of tank: 180×450×500

Treatment condition: the apparatus (B) was operated, and the treatment was performed at room temperature for 5 minutes.

12. Dilute sulfuric acid washing step (10% $H_2SO_4$)

Inner dimension of tank: 180×450×500

Treatment condition: the apparatus (B) was operated, and the treatment was performed at room temperature for 5 minutes.

13. Water washing step

Inner dimension of tank: 180×450×500

Treatment condition: the apparatus (B) was operated, and the treatment was performed at room temperature for 5 minutes.

14. pre-dip step (use of EMPLATE PC-236 (pretreating agent), a product of MELTEX Co. Ltd. of Japan (trade name) containing chlorate)

Inner dimension of tank: 180×450×500

Treatment condition: the apparatus (B) was operated, and the treatment was performed at room temperature for 5 minutes.

15. Activation step (use of EMPLATE a product of MELTEX Co. Ltd. of Japan activater 444 (trade name) which is colloidal solution containing Sn ions and Pd ions)

Inner dimension of tank: 180×450×500

Treatment condition: the apparatus (B) was operated, and the treatment was performed at room temperature for 5 minutes.

16. Water washing step

Inner dimension of tank: 180×450×500

Treatment condition: the apparatus (B) was operated, and the treatment was performed at room temperature for 5 minutes.

17. Acceleration step (use of MELPLATE PA-360 (accelerating agent), a product of MELTEX Co. Ltd. of Japan (trade name) containing surfactant)

Inner dimension of tank: 180×450×500

Treatment condition: the apparatus (B) was operated, and the treatment was performed at room temperature for 5 minutes.

18. Water washing step

Inner dimension of tank: 180×450×500

Treatment condition: the apparatus (B) was operated, and the treatment was performed at room temperature for 5 minutes.

19. Electroless copper plating step (use of MELPLATE Cu-390 (electroless copper plating agent), a product of MELTEX Co. Ltd. of Japan (trade name) which is conformed with the composition of Example 1)

Inner dimension of tank: 180×750×500

Treatment condition: the apparatuses (A),(B),(C) and (D) were operated, and the treatment was performed at room temperature for 20 minutes.

20. Water washing step

Inner dimension of tank: 180×450×500

Treatment condition: the apparatus (B) was operated, and the treatment was performed at room temperature for 5 minutes.

21. Dilute sulfuric acid washing step (10% $H_2SO_4$)

Inner dimension of tank: 180'450×500

Treatment condition: the treatment was performed at room temperature for 1 minutes.

22. Electroplating step (copper plating bath which is conformed with the composition of Example 1)

Inner dimension of tank: 180×750×500

Treatment condition: the apparatuses (A), (B), (C) and (D) were operated, and the treatment was performed at 30° C. for 20 minutes.

23. Water washing step

Inner dimension of tank: 180×450×500

Treatment condition: the apparatus (B) was operated, and the treatment was performed at room temperature for 5 minutes.

The tanks of Nos. 1, 3, 6, 19 and 22 are designed to be larger by the size corresponding to the apparatus (A).

Estimation

Maximum current density 12.0 A/dm$^2$

Plating adhesion to through hole above 90%

σ 1.2 gas pit fraction defective 0%

What is claimed is:

1. A pretreatment method for a plating method to successfully treat a plating target where the pretreatment method is carried out in a cleaning tank and in at least one of an electroless plating tank or an electroplating tank, characterized in that the pretreatment method comprises the following steps (A) to (D) which are carried out simultaneously in a single tank at a time:

(A) a step of vibrationally stirring a treatment bath, by a vibration vane at an amplitude ranging from 0.5 mm to 3.0 mm and at a vibrational frequency of 200 to 800 times per minute, (B) a step of performing an aeration in the treatment bath, (C) a step of swinging the plating target, and (D) a step of applying vibration to the plating target.

2. The plating method as claimed in claim 1, wherein the aeration is performed by using air bubbles generated by a diffuser having a pore opening of 200 to 400 μm.

3. The plating method as claimed in claim 1, wherein the plating target is swung at a swing amplitude from 10 to 100 mm and at a swing frequency of 10 to 30 times per minute.

4. The plating method as claimed in claim 1, wherein the plating target is vibrated at an amplitude from 0.5 to 1.0 mm and at a frequency of 100 to 300 time minute.

5. The plating method as claimed in claim 1, wherein the aeration is performed by using air bubbles generated by a diffuser having a pore opening of 200 to 400 μm; the plating target is swung at a swing amplitude from 10 to 100 mm and at a swing frequency of 10 to 30 times per minute; and, the plating target is vibrated at an amplitude from 0.5 to 1.0 mm and at a frequency of 100 to 300 times per minute.

6. The plating method as claimed in claim 1, wherein the plating target has pores each having opening size of less than 0.1 mm.

7. The plating method as claimed in claim 1, wherein the plating target is a laminate board having a surface made of plastic.

8. A plating method for successively treating a plating target from a pretreatment step for plating until a plating step comprised of:

A) vibrationally stirring a treatment bath using a vibration stirring apparatus comprising vibration generating means where said means comprise a vibration motor, vibrationally stirring means for vibrating at an amplitude of 0.5 to 3.0 mm and at a vibrational frequency of 200 to 800 times per minute, a vibration vane which is fixed in one stage or in multistage to a vibrating bar which vibrates in the treatment bath interlockingly with the vibration generating means, an inverter for controlling the vibration motor of the vibrationally stirring apparatus (A) to generate any frequency in the range from 10 to 500 Hz, and vibration stress dispersing means at a connection point of the vibration generating means and the vibrationally stirring means;

B) aerating the treatment bath using an aeration apparatus comprised of ceramic diffusing pipes each having a pore-size of 200 to 400 microns and porosity of 30 to 40%;

C) swinging the plating target in the treatment bath using an apparatus having an electrode bar on which the plating target is suspended, wherein the apparatus generates in the plating target a swinging motion of 10 to 100 mm in swinging amplitude and 10 to 30 times per minute in frequency through the electrode bar;

D) vibrating the plating target in the treatment bath using an apparatus which applies a vibration to the plating target through the electrode bar at an amplitude from 0.5 to 1.0 mm, the apparatus including a vibration motor whose frequency is adjusted to 10 to 60 Hz by an inverter and is vibrated so as to apply a vibration of 100 to 300 times per minute in frequency to the plating target, wherein the above are operated in a cleaning tank and at least one of an electroless plating tank or an electroplating tank used as a pretreatment tank in a pretreatment step and a plating step.

9. The plating method as claimed in claim 8, wherein the plating target has pores each having opening size of less than 0.1 mm.

10. The plating method as claimed in claim 8, wherein the plating target is a laminate board having a surface made of plastic.

11. The plating method as claimed in claim 8, wherein a cleaning tank, a first water washing tank, a catalyzer tank, a second water washing tank, an electroless plating tank, a third water washing tank, an electroplating tank and a fourth water washing tank are provided in this order in the pretreatment step and the plating step, and the plating target is treated in these tanks in the above order.

12. The plating method as claimed in claim 8, wherein the vibration vane of the vibrationally stirring apparatus (A) is sandwiched and fixed by vibration vane fixing members via a fluorine-based polymer film.

13. The plating method of claim 8 wherein the ratio of the frequency of the vibration motor of D to the frequency of the vibration motor of A is in the range of 50% to 65%.

* * * * *

UNITED STATES PATENT AND TRADEMARK OFFICE
CERTIFICATE OF CORRECTION

PATENT NO. : 6,261,435 B1
DATED : July 17, 2001
INVENTOR(S) : Ryushin Omasa

Page 1 of 1

It is certified that error appears in the above-identified patent and that said Letters Patent is hereby corrected as shown below:

<u>Column 16,</u>
Lines 65-66, kindly change "successfully" to -- successively --;

<u>Column 18,</u>
Line 3, kindly change "point" to -- portion --;
Line 24, kindly change "pretreatment" to -- treatment --;
Line 25, kindly change "pretreatment" to -- treatment.

Signed and Sealed this

Twenty-ninth Day of January, 2002

Attest:

Attesting Officer

JAMES E. ROGAN
*Director of the United States Patent and Trademark Office*